(12) United States Patent
Hirata

(10) Patent No.: US 6,741,625 B2
(45) Date of Patent: May 25, 2004

(54) SEMICONDUCTOR LASER

(75) Inventor: Shoji Hirata, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/986,182

(22) Filed: Nov. 7, 2001

(65) Prior Publication Data

US 2002/0075930 A1 Jun. 20, 2002

(30) Foreign Application Priority Data

Nov. 7, 2000 (JP) .................................... P2000-338687

(51) Int. Cl.$^7$ ................................................. H01S 5/00
(52) U.S. Cl. ........................................ 372/50; 372/43
(58) Field of Search ............................. 372/43–50, 54

(56) References Cited

U.S. PATENT DOCUMENTS

| | | | | |
|---|---|---|---|---|
| 4,860,298 A | * | 8/1989 | Botez et al. ................... | 372/45 |
| 5,063,570 A | * | 11/1991 | Botez et al. ................... | 372/50 |
| 5,253,265 A | * | 10/1993 | Seko et al. .................... | 372/46 |
| 5,425,043 A | * | 6/1995 | Holonyak et al. ............. | 372/50 |
| 5,533,042 A | * | 7/1996 | Fukunaga et al. ............. | 372/50 |
| 5,563,901 A | * | 10/1996 | Otoma et al. ................. | 372/50 |
| 5,588,016 A | * | 12/1996 | Otoma et al. ................. | 372/46 |
| 5,608,716 A | * | 3/1997 | Koyama et al. ............ | 369/275.1 |
| 5,648,295 A | * | 7/1997 | Otoma et al. ................. | 438/45 |
| 5,699,375 A | * | 12/1997 | Paoli ............................ | 372/50 |
| 5,742,631 A | * | 4/1998 | Paoli ............................ | 372/50 |
| 5,764,676 A | * | 6/1998 | Paoli et al. ................... | 372/50 |
| 5,809,052 A | * | 9/1998 | Seko et al. .................... | 372/50 |
| 6,031,860 A | * | 2/2000 | Nitta et al. ................... | 372/50 |
| 6,052,399 A | * | 4/2000 | Sun ............................... | 372/50 |
| 6,262,540 B1 | * | 7/2001 | Seko ........................ | 315/169.1 |
| 6,320,891 B1 | * | 11/2001 | Seko ............................ | 372/50 |
| 6,455,347 B1 | * | 9/2002 | Hiraishi et al. ............... | 438/80 |
| 6,459,714 B1 | * | 10/2002 | Narui et al. .................. | 372/48 |

* cited by examiner

*Primary Examiner*—Paul Ip
*Assistant Examiner*—Tuan Nguyen
(74) *Attorney, Agent, or Firm*—Rader, Fishman & Grauer PLLC; Ronald P. Kananen

(57) ABSTRACT

The present invention provides a semiconductor laser including a plurality of light emission portions provided on the same substrate, each of which is adapted to emit laser beams with a multi-mode. A part of the plurality of light emission portions constitute a main light emission group, and the rest of the plurality of light emission portions constitute a sub-light emission group. A main electrode for supplying a current to the main light emission group and a sub-electrode for supplying a current to the sub-light emission group are separately provided. With this configuration, it is possible to keep the entire quality of laser beams of the semiconductor laser constant.

6 Claims, 4 Drawing Sheets

SEMICONDUCTOR LASER

BACKGROUND OF THE INVENTION

The present invention relates to a semiconductor laser including an array of a plurality of light emission portions, each of which is particularly adapted to emit laser beams with a multi-mode.

Recently, high output semiconductor lasers have been actively developed. These high output semiconductor lasers are used, for example, as excitation sources of solid lasers, light sources of laser welding, and light sources for communication.

As such high output semiconductor lasers, there are known a broadarea type in which a light emission region is widely formed and an array type in which a plurality of the broad-area type light emission regions are formed for realizing a higher output.

FIG. 8 is a typical sectional view illustrating a configuration of a related art broad-area type array laser. In this semiconductor laser, for example, a cladding layer 11 made from n-type AlGaAs, an active layer 12 made from AlGaAs, and a cladding layer 13 made from p-type AlGaAs are formed on a substrate 10 made from n-type GaAs; and a current block layer 13 is formed on the cladding layer with a pattern in which portions B of the current block layer are spaced from each other with a specific pitch. An n-side electrode M0 is formed overall on the substrate 10 side, and a p-side electrode M is formed overall on the cladding layer 13 side.

When a current is applied between the n-side electrode M0 and the p-side electrode M, the current is concentratedly injected in each gap between two adjacent current block layer portions B, so that a portion of the active layer 12 corresponding to such an area in which the current has been injected becomes a light emission portion LD. The width of each of the light emission portions LD is determined by the width of the gap between two adjacent current block layer portions B. In the case of a broad-area type array laser, the width of each of the light emission portions LD is set to ten $\mu$m or more (for example, several tens $\mu$m). In such a broad-area type array laser which includes, for example, several tens of the light emission portions LD, it is possible to obtain a laser beam output of several tens watts in total.

The above-described semiconductor laser, however, has the following problem: namely, since the semiconductor laser includes a plurality of high output light emission portions, when all of the light emission portions are simultaneously driven, a large amount of heat is generated. Although a heat sink, such as a Peltier device, is provided for suppressing the heat generation of the light emission portions, the heat sink is not sufficient to prevent the light emission portions from being thermally deteriorated. In particular, if part of the light emission portions is deteriorated, not only is the quantity of light reduced as a whole, but also if the current injection is continued, the amount of heat generated is increased, thus exert in an adverse effect on the other light emission portions.

SUMMARY OF THE INVENTION

An object of the present invention is to provide a board-area type, array-semiconductor laser capable of keeping the entire quantity of laser beams constant.

To achieve the above object, according to an aspect of the present invention, there is provided a semiconductor laser including a plurality of light emission portions provided on the same substrate, each of which is adapted to emit laser beams with a multi-mode, wherein part of the plurality of light emission portions constitutes a main light emission group and the rest of the plurality of light emission portions constitute a sub-light emission group, a main electrode for supplying a current to the main light emission group and a sub-electrode for supplying a current to the sub-light emission group are separately provided.

With this configuration, since the plurality of light emission portions, each of which is adapted to emit laser beams with a multi-mode, is divided into the main light emission group and the sub-light emission group, a current can be supplied to the main light emission group via the main electrode, a current can be supplied to the sub-light emission group via the sub-electrode. As a result, in a normal state, a current may be supplied to the main light emission group via the main electrode, and laser beams emitted from the light emission portions constituting the main light emission group are used, and if the output of laser beams emitted from the main light emission group is reduced for some reason, a current may be supplied to the sub-light emission group via the sub-electrode to obtain a desired output of laser beams from the light emission portions constituting the sub-light emission group.

DETAILED DESCRIPTION OF THE PREFERRED EMBODIMENTS

Hereinafter, preferred embodiments of the present invention will be described with reference to the accompanying drawings.

Figure 1:
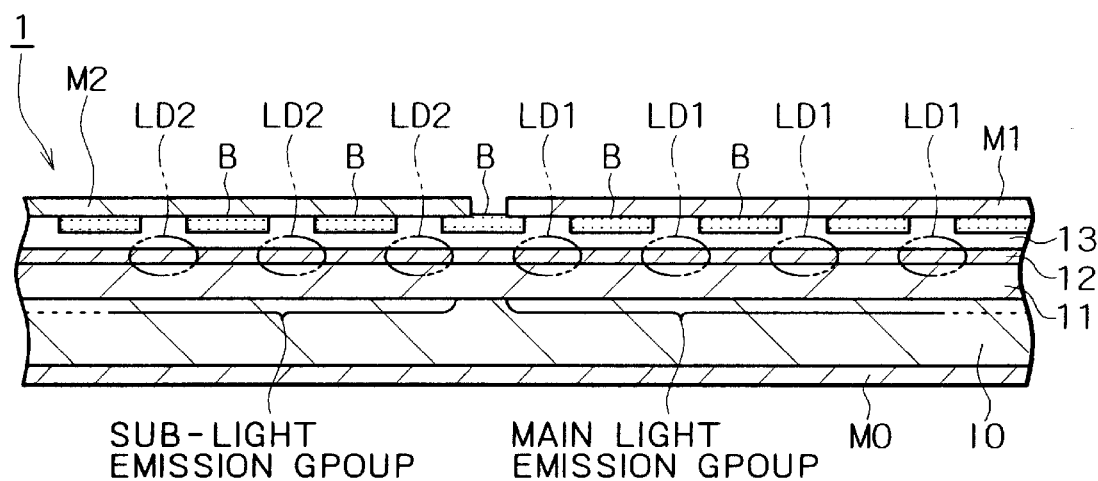
FIG. 1 is a typical sectional view illustrating a semiconductor laser according to a first embodiment.

FIG. 1 is a typical sectional view illustrating a semiconductor laser according to a first embodiment. A semiconductor laser 1 in this embodiment includes a plurality of light emission portions LD1 and a plurality of light emission portions LD2, which are formed on the same substrate 10, wherein each of the light emission portions LD1 and LD2 is configured to emit laser beams with a multi-mode. The light emission portions LD1 are taken as a main light emission group, and the light emission portions LD2 are taken as a sub-light emission group. A current is supplied from a main electrode M1 to the light emission portions LD1 of the main light emission group, and a current is supplied from a sub-electrode M2 to the light emission portions LD2 of the sub-light emission group.

The substrate 10 of the semiconductor laser 1 may be made from, for example, an n-type GaAs, AlGaInP, ZnSe, GaN, InGaAs, or an InP-based semiconductor. According to this embodiment, the substrate 10 is made from the n-type GaAs-based semiconductor.

An n-type cladding layer 11 is formed on the substrate 10. The n-type cladding layer 11 is typically made from $Al_{0.4}Ga_{0.6}As$. An active layer 12 is formed on the n-type cladding layer 11. The active layer 12 is typically made from non-doped $Al_{0.7}Ga_{0.3}As$.

A p-type cladding layer 13 is formed on the active layer 12. The p-type cladding layer 13 is typically made from $Al_{0.4}Ga_{0.6}As$. On the p-type cladding layer 13, a current block layer is formed with a pattern in which portions B of the current block layer are spaced from each other with a specific pitch. The current block layer portions B are provided for concentrating current injection at portions of the active layer 12. To be more specific, a current is injected in a portion of the active layer 12 through a gap between two adjacent current block layer portions B. The portion of the active layer 12 in which the current has been thus injected, is taken as one of the light emission portions LD1 and LD2.

The width of each of the light emission portions LD1 and LD2 is set by the width of the gap between two adjacent current block layer portions B. According to this embodiment, the width of each of the light emission portions LD1 and LD2 is set to several tens $\mu m$. With this configuration, the semiconductor laser 1 can be configured as a broad-area type array laser capable of emitting laser beams with a multi-mode. On the other hand, a gap between two adjacent light emission portions LD1 and LD2 is determined by the width of each of the current block layer portions B.

On the p-type cladding layer 13 on which the current block layer portions B have been formed, the above-described main electrode M1 and the sub-electrode M2 are formed. These electrodes can be formed easily by forming an electrode overall on the cladding layer 13 and dividing the electrode into two parts at a specific position. An n-side electrode M0 is formed overall on the back surface of the substrate 10.

Figure 2:
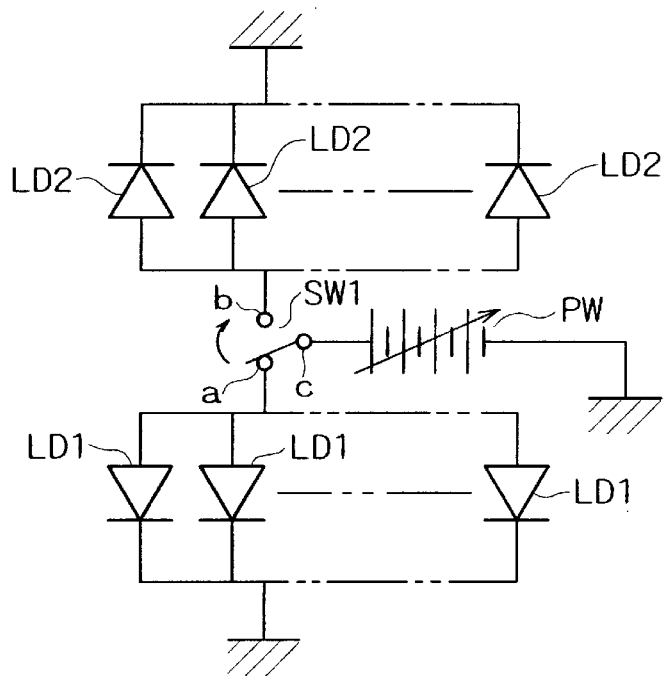
FIG. 2 is a circuit diagram illustrating a wiring example of the semiconductor laser according to the first embodiment.

Both the main electrode M1 and the sub-electrode M2 are wired such that voltages can be separately applied thereto. FIG. 2 is a circuit diagram illustrating a wiring example of the semiconductor laser in this embodiment. Anode sides of the plurality of the light emission portions LD1 are connected in parallel to the main electrode M1 (see FIG. 1), and anode sides of the plurality of the light emission portions LD2 are connected in parallel to the sub-electrode M2 (see FIG. 1). In addition, cathode sides of the light emission portions LD2 and cathode sides of the light emission portions LD1 are grounded via the n-side electrode M0 (see FIG. 1).

A switch SW1 is provided outside the semiconductor laser 1. One contact "a" of the switch SW1 is connected to the anode sides of the light emission portions LD1, that is, the main electrode M1, and the other contact "b" of the switch SW1 is connected to the anode sides of the light emission portions LD2, that is, the sub-electrode M2. A common terminal "c" of the switch SW1 is connected to a power source PW.

With such wiring, in the case of performing a normal drive of the semiconductor laser 1, the common terminal "c" of the switch SW1 is connected to the contact "a", to apply a voltage from the power source PW to the main electrode M1. As a result, a current is injected from the main electrode M1 to the main light emission group, so that laser beams are emitted from each of the light emission portions LD1 of the main light emission group.

It is now assumed that there arises a problem of deterioration of part of the light emission portions LD1 of the main light emission group, and, consequently, the total quantity of light of the main light emission group is reduced. In this case, the switch SW1 is turned to connect the common terminal "c" to the contact "b", so that the voltage from the power source PW is applied to the sub-electrode M2, and thereby a current is injected from the sub-electrode M2 to the sub-light emission group. As a result, laser beams are emitted from each of the light emission portions LD2 of the sub-light emission group.

With this configuration, since the light emission portions LD2 of the sub-light emission group can be used as spares of the light emission portions LD1 of the main light emission group, it is possible to prolong the service life of the semiconductor laser 1.

Figure 3:
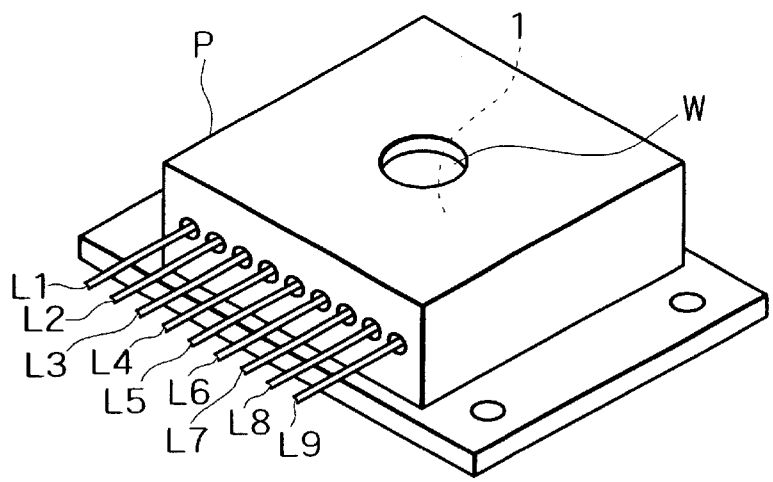
FIG. 3 is a perspective view illustrating an example in which the semiconductor laser according to the first embodiment is contained in a package.

FIG. 3 is a perspective view showing an example in which the semiconductor laser in this embodiment is contained in a package. As shown, a package P has a window W for allowing laser beams emitted from the semiconductor laser 1 contained in the package P to be released therethrough to the outside. The package P is provided with nine external leads L1 to L9.

Figure 4:
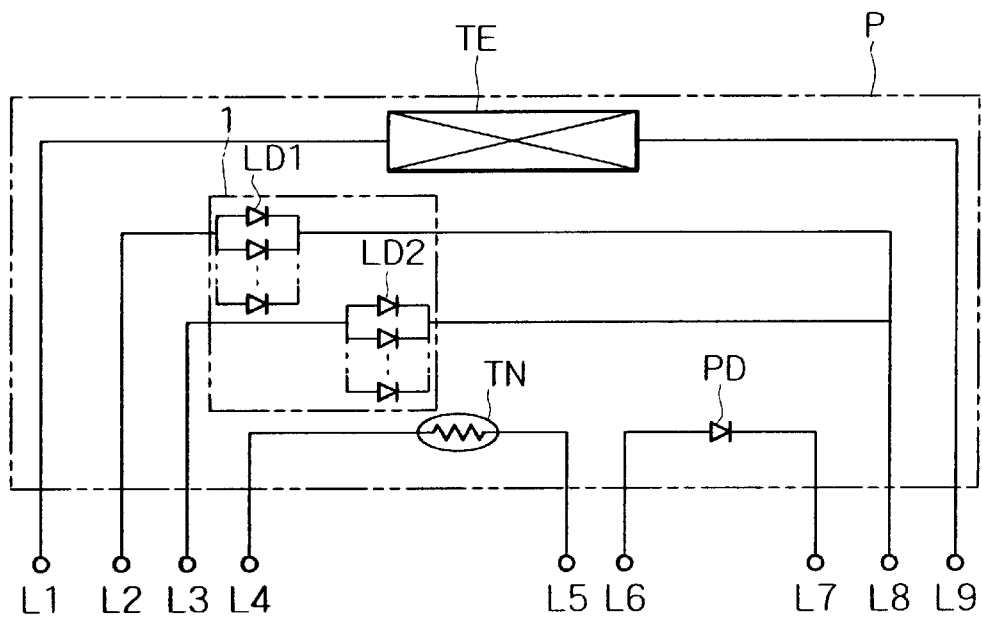
FIG. 4 is a circuit diagram illustrating a correspondence between external leads and an internal circuit in the package.

FIG. 4 is a circuit diagram illustrating a correspondence between the external leads and an internal circuit in the package. The package P contains a Peltier device TE as a heat sink for suppressing heat generation of the semiconductor laser 1. The Peltier device TE is connected between the external leads L1 and L9.

The package P also contains a thermister TN for detecting the temperature in the package P, which is connected between the external leads L4 and L5. The package P further contains a photo-diode PD for monitoring the output of the semiconductor laser 1, which is connected between the external leads L6 and L7.

According to this embodiment, one semiconductor laser 1 contained in the package P is divided into the main light emission group and the sub-light emission group. As a result, voltages can be separately applied to the light emission portions LD1 constituting the main light emission group and the light emission portions LD2 constituting the sub-light emission group.

For this purpose, the anodes of the light emission portions LD1 of the main light emission group are connected to the external lead L2, and the anodes of the light emission portions LD2 of the sub-light emission group are connected to the external lead L3. In addition, the cathodes of the light emission portions LD1 and the cathodes of the light emission portions LD2 are commonly connected to the external lead L8.

With such package wiring, the light emission portions LD1 of the main light emission group can be operated by applying a voltage to the external lead L2, and the light emission portions LD2 of the sub-light emission group can be operated by applying a voltage to the external lead L3. To be more specific, the two light emission groups contained in one package P can be switchingly used by switching the connection of the contact "a" of the switch SW1 shown in FIG. 2 to the external lead L2 to or from the connection of the contact "b" of the switch SW1 to the external lead L3.

Although the switch SW1 is used for switching the main light emission group to or from the sub-light emission group in this embodiment, the present invention is not limited thereto but may be configured such that the power source is usually connected only to the external lead L2 to drive the main light emission group, and if the main light emission group is deteriorated, one end of a wiring portion with the other end connected to the power source is re-wired from the external lead L2 to the adjacent external lead L3 to drive the sub-light emission group.

In this embodiment, the main light emission group is switched to or from the sub-light emission group; however, the present invention is not limited thereto and may be configured such that if part of the light emission portions LD1 of the main light emission group is deteriorated, the deteriorated light emission portions LD1 of the main light emission group can be compensated by part of the light emission portions LD2 of the sub-light emission group. For example, the number of the light emission portions LD2 of the sub-light emission group is set to about 20% of the number of the light emission portions LD1 of the main light emission group. Such setting can be performed by determining the ratio in area between the main electrode M1 and the sub-electrode M2.

In a normal state, the emission of laser beams is performed by using the light emission portions LD1 of the main light emission group, and if an output of the main light emission group is reduced by, for example, 20%, a voltage is supplied to the sub-light emission group while the voltage is continuously applied to the main light emission group. That is to say, if the output of the main light emission group is reduced, both the main light emission group and the sub-light emission group are driven, so that the reduction in output caused in the main light emission group is compensated by the drive of the sub-light emission group.

It is to be noted that the form of the package and the wiring of the external leads described above and illustrated in the drawings are for illustrative purposes only, and, therefore, the present invention is not limited thereto. Also, the ratio in area between the main light emission group and the sub-light emission group is not limited to that described above and illustrated in the drawings. Further, although one main light emission group and one sub-light emission group are provided in this embodiment, the present invention is not limited thereto. For example, a plurality of the main light emission groups and a plurality of the sub-light emission groups may be provided, more specifically, in such a manner as to be alternated with each other.

The ratio in area between the main light emission group and the sub-light emission group and the layout of the main light emission group and the sub-light emission group can be adjusted by either changing the ratio in area between the main electrode M1 and the sub-electrode M2 and the layout of the main electrode M1 and the sub-electrode M2 or changing the wiring between the main electrode M1 and the sub-electrode M2 and the external leads.

Figure 5:
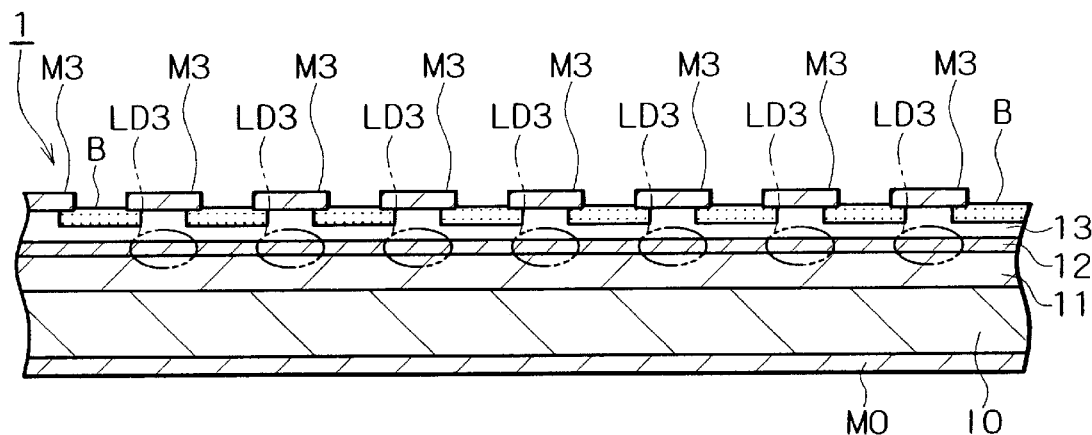
FIG. 5 is a typical sectional view illustrating a semiconductor laser according to a second embodiment.

A second embodiment of the present invention will be described below. FIG. 5 is a typical sectional view illustrating a semiconductor laser according to the second embodiment. A semiconductor laser 1 according to the second embodiment is the same as the semiconductor laser 1 according to the first embodiment in terms of configurations of a substrate 10, an n-type cladding layer 11, an active layer 12, a p-type cladding layer 13, current block layer portions B, and an n-side electrode M0 on the back surface of the substrate 10, but it is different therefrom in that electrodes M3 are separately provided on the p-type cladding layer 13 in a one-to-one relationship with light emission portions LD3.

To be more specific, in the semiconductor laser 1 according to the second embodiment, each of the light emission portions LD3, which is formed at the portion of the active layer 12 corresponding to a gap between two adjacent current block layer portions B, can be driven by the corresponding one of the electrodes M3.

In this case, a wiring pattern corresponding to the electrodes M3 is previously formed on a base (not shown) for mounting the semiconductor laser 1, the semiconductor laser 1 is mounted to the base, and each electrode M3 is connected to the corresponding wiring portion of the wiring pattern by a bonding wire. Alternatively, a wiring pattern corresponding to the electrodes M3 is previously formed on the base, the semiconductor laser 1 is mounted on the base in a face-down manner with the electrode M3 side directed to the base, and each electrode M3 is connected to the opposed wiring portion of the wiring pattern on the base.

Such a semiconductor laser 1 is, according to this embodiment, provided with control means for supplying a voltage to each electrode M3 via the corresponding wiring portion of the wiring pattern. With this configuration, the light emission portions LD3 of the semiconductor laser 1 can be controlled individually.

Figure 6:
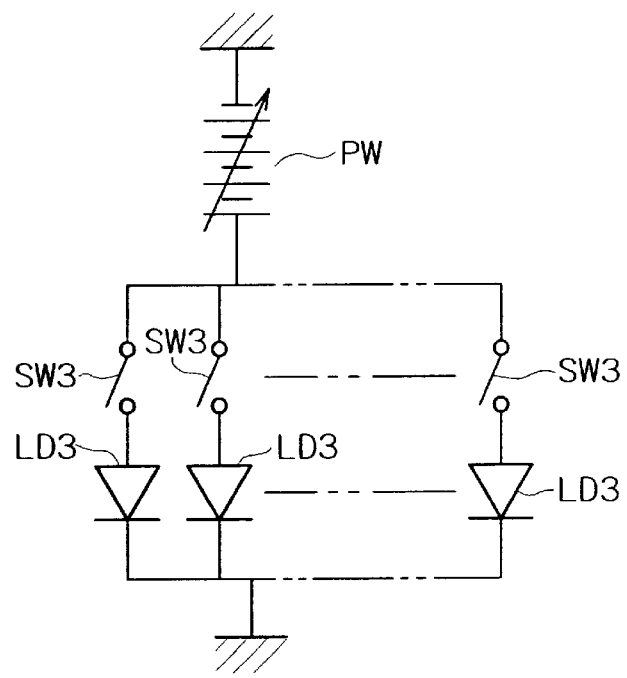
FIG. 6 is a circuit diagram illustrating a wiring example of the semiconductor laser according to the second embodiment.

FIG. 6 is a circuit diagram illustrating a wiring example of the semiconductor laser 1 according to the second embodiment. Cathodes of a plurality of the light emission portions LD3 are grounded via the n-side electrode M0 (see FIG. 5). On the other hand, anodes of the light emission portions LD3 are each connected to a power source PW via a switch SW3. In this case, each switch SW3 is taken as the control means for driving the corresponding one of the light emission portions LD3.

In the case of using the semiconductor laser 1, part of the plurality of the light emission portions LD3 is taken as a main light emission group, and the rest of the plurality of the light emission portions LD3 is taken as a sub-light emission group. In a normal state, the light emission portions LD3 of the main light emission group are connected to the power source PW by closing the switches SW3 corresponding thereto, thereby to apply voltages to them. As a result, the light emission portions LD3 of the main light emission group are driven to obtain a desired output of laser beams.

It is now assumed that part of the light emission portions LD3 of the main light emission group is deteriorated. If the semiconductor laser 1 is continuously operated in the deteriorated state, there may arise a problem that the deteriorated light emission portions LD3 cause heat generation, thereby exerting an adverse effect on the rest of the light emission portions LD3. To solve such a problem, the connection of the deteriorated light emission portions LD3 to the power source PW is cut off by opening the switches SW3 corresponding thereto to stop the drive of only the deteriorated light emission portions LD3.

In such a state, the output of the laser beams is reduced. To compensate for such a reduction in the output of the laser beams, among the light emission portions LD3 of the sub-light emission group, those of the number equivalent to those of the deteriorated light emission portions LD3 of the main light emission group are driven by closing the switches SW3 corresponding thereto. As a result, even if the drive of the deteriorated light emission portions LD3 of the main light emission group is stopped, it can be compensated for by the drive of part of the light emission portions LD3 of the sub-light emission group, with the result that the semiconductor laser 1 can keep the total quantity of laser beams constant.

In the semiconductor laser 1 according to the second embodiment, since the light emission portions LD3 can be individually driven, the deterioration of each of the light emission portions LD3 can be easily detected, for example, by applying voltages having different frequencies to the light emission portions LD3 and receiving the quantity of laser beams emitted from each of the light emission portions LD3. In accordance with this detection method, since the light emission portions LD3 are driven by the voltages having different frequencies, laser beams emitted therefrom also have different frequencies. Accordingly, a specific one of the laser beams thus received, which is distinguished from the rest of the laser beams in frequency, can be selectively extracted by using filter means, with the result that it can be decided from which light emission portion LD3 the specific one of the laser beams is emitted. This makes it possible to decide the degree of deterioration of each of the light emission portions LD3.

Alternatively, the degree of deterioration of each of the light emission portions LD3 can be detected by applying voltages to the light emission portions LD3 in order and detecting the output of laser beams emitted from each of the light emission portions LD3. In accordance with this detection method, since the output of laser beams emitted from the deteriorated light emission portion LD3 is reduced, it can be decided that the light emission portion LD3, to which the voltage is applied at the time of detecting the reduction in output of laser beams, is deteriorated.

In the case where the semiconductor laser 1 according to the second embodiment is contained in a package, the electrodes M3 corresponding to the light emission portions LD3 are individually connected to external leads. Accordingly, in the package, it is required to provide the external leads of a number at least corresponding to the number of the light emission portions LD3 and one external lead to be connected to the common cathodes of the light emission portions LD3.

Figure 7:
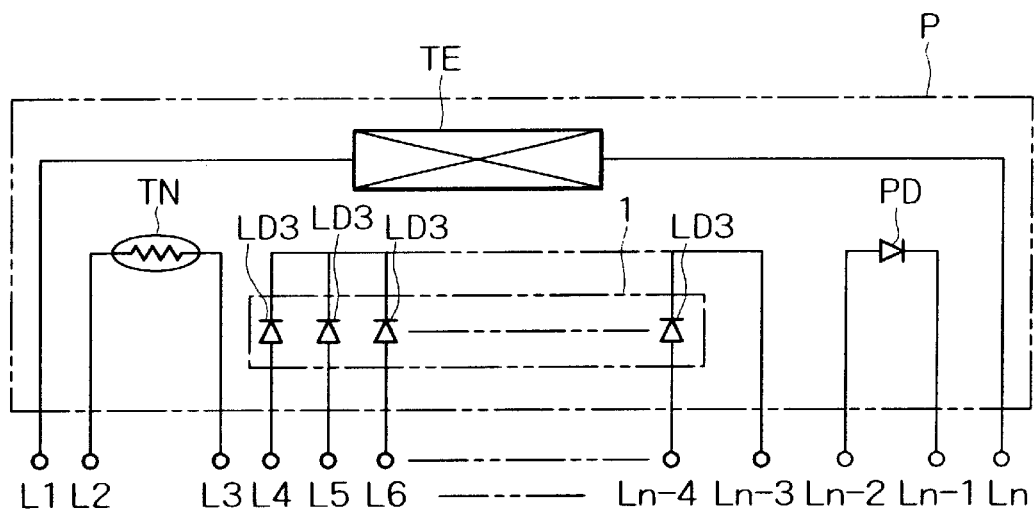
FIG. 7 is a circuit diagram illustrating a correspondence between external leads and an internal circuit in a package in which the semiconductor laser according to the second embodiment is contained.
Figure 8:
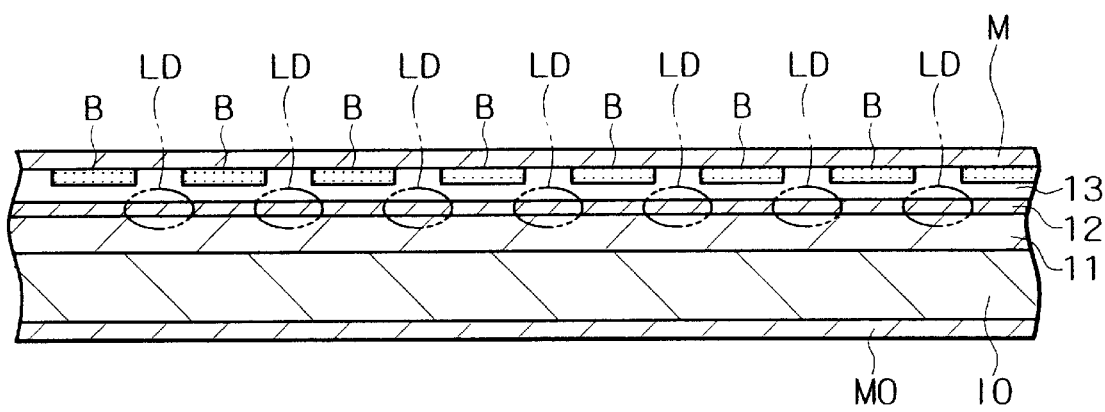
FIG. 8 is a typical sectional view illustrating a configuration of a related art broad-area type array laser.

FIG. 7 is a circuit diagram illustrating a correspondence between the external leads and an internal circuit in the package which contains the semiconductor laser according to the second embodiment. As shown, external leads of the total number of "n", which are designated by reference characters L1 to Ln, are provided in a package P.

The package P contains a Peltier device TE as a heat sink for suppressing heat generation of the semiconductor laser 1. The Peltier device TE is connected between the external leads L1 and Ln.

The package P also contains a thermister TN for detecting the temperature in the package P, which is connected between the external leads L2 and L3. The package P further contains a photo-diode PD for monitoring the output of the semiconductor laser 1, which is connected between the external leads L(n−1) and L(n−2).

According to the second embodiment, one semiconductor laser 1 is contained in the package P, and the electrodes M3 (see FIG. 5) are provided for the light emission portions LD3 in a one-to-one relationship therebetween. Accordingly, the external leads are allocated for the electrodes M3 of the light emission portions LD3 in the one-to-one relationship. In this package P, the external leads L4 to L(n−4) are connected to the light emission portions LD3 in the one-to-one relationship therebetween. Additionally, the cathodes of the light emission portions LD3 are commonly connected to the external lead L(n−3).

With this package wiring, each of the light emission portion LD3 can be operated by applying a voltage to the corresponding one of the external leads L4 to L(n−4). Accordingly, the light emission portions LD3 of the main light emission group and the light emission portions LD3 of the sublight emission group can be selectively driven by selectively applying voltages to the necessary external leads.

Although the switches SW1 shown in FIG. 7 are individually provided for the light emission portions LD3 according to this embodiment, the present invention is not limited thereto but may be configured such that the power source is usually connected only to the external leads connected to the usually driven light emission portions LD3 of the main light emission group; and if part of the light emission portions LD3 of the main light emission group is deteriorated, oneend of the wiring portions (with the other end connected to the power source) are re-wired from the external leads connected to the deteriorated light emission portions LD3 of the main light emission group to the external leads connected to the light emission portions of the sublight emission group.

According to the second embodiment, since the light emission portions LD3 are controlled so as to be individually driven, if a part of the light emission portions LD3 liable to be deteriorated that are located in a specific area are previously decided, the injection amount of the current to the part of the light emission portions LD3 may be made smaller than the injection amount of the current to the rest of the light emission portions LD3. With this configuration, it is possible to prolong the service life of the entire semiconductor laser 1.

As described above, the present invention has the following effect: namely, since the broad-area type array-semiconductor laser of the present invention is configured such that a plurality of the light emission portions are divided into a main light emission group and a sub-light emission group and thereby selectively driven, even if the output of laser beams emitted from the main light emission group is reduced for some reason, the entire output of laser beams can be kept constant by driving the sub-light emission group. This makes it possible to prolong the service life of one semiconductor laser and, hence, to improve the reliability of a system using a high output semiconductor laser.

While the preferred embodiments of the present invention have been described using the specific terms, such description is for illustrative purposes only, and it is to be understood that changes and variations may be made without departing from the spirit or scope of the following claims.

What is claimed is:

1. A semiconductor laser having a substrate, comprising:
   a first cladding layer formed on said substrate;
   an active layer formed on said first cladding layer;
   a plurality of light emission portions provided in said active layer, for emitting laser beams with a multi-mode, wherein a first group of said plurality of light emission portions constitutes a main light emission group, and a second group of said plurality of light emission portions constitutes a sub-light emission group;
   a second cladding layer formed on said active layer;
   a main electrode provided on said second cladding layer and above said main light emission group for supplying a current to said main light emission group; and
   a sub-electrode provided on said second cladding layer and above said sub-light emission group for supplying a current to said sub-light emission group wherein said plurality of light emission portions for each of said first and second groups are adjacent.

2. A semiconductor laser according to claim 1, wherein said main electrode and said sub-electrode are connected to separate external leads.

3. A semiconductor laser according to claim 1, further comprising switching means for switching the supply of current between said main electrode and said sub-electrode.

4. A semiconductor laser comprising:

a substrate;

a first cladding layer provided on said substrate;

an active layer formed on said first cladding layer;

a plurality of light emission portions provided in series in said active layer for emitting laser beams with a multi-mode;

a second cladding layer formed on said active layer; and at least two electrodes provided on said second cladding layer, wherein each electrode supplies current to at least two of said plurality of light emission portions in series, respectively, and wherein each electrode is located above the at least two of said plurality of light emission portions to which current is supplied.

5. A semiconductor laser according to claim 4, wherein said electrodes are separately connected to external leads.

6. A semiconductor laser according to claim 4, further comprising control means for controlling the supply of current to each of said electrodes.

* * * * *